(12) United States Patent
Duff

(10) Patent No.: US 7,460,967 B2
(45) Date of Patent: Dec. 2, 2008

(54) SELECTABLE NAVIGATION TO AUTOMATICALLY DISCOVERED EVENTS WITHIN THE ACQUISITION RECORD OF A DIGITAL SAMPLING OSCILLOSCOPE

(75) Inventor: Christopher P Duff, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 180 days.

(21) Appl. No.: 11/476,546

(22) Filed: Jun. 28, 2006

(65) Prior Publication Data

US 2008/0001949 A1 Jan. 3, 2008

(51) Int. Cl.
*G01R 23/02* (2006.01)

(52) U.S. Cl. ............... 702/67; 702/66; 702/68; 702/69; 702/70; 702/71; 702/72; 702/73; 702/74; 702/75; 702/76; 324/121 R; 324/76.19; 324/76.28; 324/76.58; 375/226; 375/227

(58) Field of Classification Search ............ 702/66, 702/67, 69, 85, 89; 345/440.1; 324/76.19, 324/76.28, 76.58, 121 R; 375/226–227
See application file for complete search history.

(56) References Cited

U.S. PATENT DOCUMENTS 6,681,191 B1 * 1/2004 Pickerd et al. ............... 702/76
7,110,898 B2 * 9/2006 Montijo et al. ............... 702/67

* cited by examiner

*Primary Examiner*—Tung S Lau
*Assistant Examiner*—Sujoy K Kundu

(57) ABSTRACT

Events discovered by an automatic measurement subsystem in the trace of a DSO are visited using a set of event navigation controls. In a TIME Mode the controls operate to display the first of those events, display the next event after the one currently displayed, display the previous event before the one currently displayed, and, display the last event. In a SEVERITY Mode the controls operate to display the best of those events, display the next best event relative to the one currently displayed, display the next worst event before the one currently displayed, and, display the worst event. The sets of navigation controls may be a mode control menu accompanied by four stylized arrow shaped buttons within a GUI that are clicked on by an operator using a mouse. One set of arrow shaped button can serve both modes, or different sets of buttons can serve each respective mode.

22 Claims, 3 Drawing Sheets

SELECTABLE NAVIGATION TO AUTOMATICALLY DISCOVERED EVENTS WITHIN THE ACQUISITION RECORD OF A DIGITAL SAMPLING OSCILLOSCOPE

INTRODUCTION AND BACKGROUND

An oscilloscope is a wonderful tool for discovering how analog electrical signals behave with the passage of time. Particularly so for signals that we classify as 'rapid,' by which we mean that the variation in the signal is too fast for strip chart recorders and data loggers. Thus, we tend to think of recorders and loggers as tools for 'steady state' signals whose values may be expected to change as required by external conditions, but not for most signals that have 'waveforms.' Indeed, the principle excellence of oscillographic techniques is that they allow us to 'see' events whose time scales are enumerated in milliseconds, microseconds, or, nanoseconds. Thus it is that analog oscilloscopes have selectable horizontal 'sweep speeds' calibrated in terms of time/division for a graticule on the CRT's faceplate.

Often, what was required from early oscilloscopes was information about the amplitude or shape of a truly cyclic signal, such as produced by an oscillator, or received from an antenna or microphone, and then amplified. The two and three inch round CRTs (Cathode Ray Tubes) of early 'scopes were thought large enough to adequately reveal such information for one to, say, five, cycles of such signal behavior. By and large, it was thought sufficient for one instance of a signal's cycle to represent the others, and unique or unusual sequences of disparate events that were too long to fit onto the viewing area of the CRT as individually recognizable events were problematic: the sweep speed needs to be at least as fast as required to resolve the shortest event into a recognizable portion of the trace, while the length needed for a trace is determined by the separation between events in the sequence, but the CRT's size limits the length of that trace. It sometimes happened that the sweep speed that produced a trace that encompassed all the events of interest was slow enough that events in the trace were crowded together to the extent that the events could not be distinguished from one another. CRTs of five inch diameter (and various rectangular sizes) later came into widespread use, and while that was a welcome development (the traces weren't so tiny, anymore), it scarcely solved the crowding problem described above.

The community of 'scope manufacturers was first obliged to provide an X5 and an X10 control that amplified the sweep voltage applied to the horizontal deflection plates, resulting in most of the trace being off screen. The horizontal position control determined what portion was on screen, and allowed the operator to 'pan' along the whole trace, provided it was recurrent, and stable, etc. This allowed an expanded view of events that were too crowded to be distinguished at the normal 'X1' setting. But if a 'scope had to emulate a strip chart recorder for an extended high speed event that occurred just once or infrequently (studies of nuclear explosions come to mind), a moving film camera was fitted to the CRT and the 'scope's internal sweep was disabled.

Later, when triggered sweeps became common, the notion of delayed sweep allowed a more elegant solution than simple horizontal magnification (which nevertheless remained on the front panels of most 'scopes). With delayed sweep a trigger initiates a variably selectable delay afterwhich the sweep is performed to create a trace. Panning is now accomplished by varying the calibrated delay.

As digital computation and digital control mechanisms became more pervasive the notion that one cycle of a signal was as good as any other became less applicable, and 'scope users in these new digital applications became creative in how to make the best use of the techniques just described to create the needed traces for sequences of disparate events. It was thus a welcome development when the DSO (Digital Sampling Oscilloscope) arrived with its memory.

The fact that a DSO has memory gives it at least two distinct advantages over its analog predecessor. The first of these is related to bandwidth. It turns out that to get all the components in the vertical path of an analog 'scope to perform at high bandwidths is a significant engineering challenge. DC coupled amplifiers that will produce a hundred or more volts peak to peak at several gigahertz at a CRT's vertical deflection plates are not practical, not to mention that the writing rate for a normal CRT does not go that high. Even before the DSO, the highest frequency analog 'scopes were sampling analog oscilloscopes (as opposed to 'real time' analog oscilloscopes) that relied upon regularly spaced (analog!) samples taken upon a repetitive waveform to recreate on the CRT an analog image of the input waveform. These analog samples (say, the charge on a tiny capacitance acquired during a very brief duration), when considered in sequence, formed a 'slow moving' analog voltage replica of the ('fast moving') applied input voltage. What the DSO does is take the sample and digitize it, and then store it in an Acquisition Memory operated as if it were a circular buffer. (The DSO might take the samples consecutively within a segment of an applied signal and at a very high rate for 'real time' operation or for 'single shot' operation, or it might let locations sampled at a slower rate drift across repeated cycles of the input signal for 'repetitive sampling,' also called 'equivalent time' operation.) It is then evident that once the digitized values are stored, they can be 'played back' at a convenient rate from a Frame Buffer using low cost raster scan techniques that are not affected by the possible high frequency (say, 20 GHz or more) nature of the applied input signal. The underlying technical issue here is that it is far easier to design and build high speed samplers and ADCs (Analog to Digital Converters) and fashion a high speed path into memory (say, by interleaving many banks of memory) than it is to design and build the equivalent actual analog signal path (amplifiers and CRT).

The second distinct advantage of the DSO over its analog parent arises because of the persistence of memory. Whereas the analog 'scope was forced to "view the signal end-on, process it in real time and get rid the fleeting result" right away, the DSO "views the signal end-on but creates a 'side view' of its activity over a segment of time that is 'permanent'" and that can be leisurely, as it were, processed, viewed and otherwise given a suitable disposition.

The notion that the signal's waveform is represented by a collection of digitized values in a memory allows a powerful extension of the notion of triggering. Whereas the analog 'scope could only unblank the beam and start the sweep subsequent to the occurrence of a trigger, the DSO can allow the operator to decide where the trigger event is to be relative to the start and end of the Acquisition Record. So, for example, if the creation of the Acquisition Record is continued until it is about to overwrite in the (circular) Acquisition Memory the location corresponding to (or most nearly corresponding to) the time when the trigger event occurred, then the Acquisition Record will produce a trace of activity occurring subsequent to the trigger, just as for analog 'scopes. But if the creation of the Acquisition Record is stopped immediately upon the occurrence of the trigger event, then what the Acquisition Record contains is the activity that lead up to the trigger (so called 'negative time'). This can be an invaluable feature that simply isn't possible with the old analog architecture, and we may speculate that this, in conjunction with the bandwidth issue, is what accounts for the decline in popularity of the 'laboratory grade' analog oscilloscope in favor of the modem DSO. If the creation of the Acquisition Record is continued for, say, half its length, then we have captured activity both before and after the triggering event.

Now let the Acquisition Record be substantial in size, perhaps large enough that it is apparently very many times wider than the Frame Buffer. A Frame Buffer might have, say, just one or two thousand addressable locations, because the physical display device has just that many horizontal pixel locations. But if the Acquisition Record has several million (or several tens of millions) of addressable locations, then there arises the issue of how to decide what image is to be stored in the Frame Buffer.

The operator may decide to 'zoom out' and let the end points of the Frame Buffer correspond to the start and end of the Acquisition Record. (Recall that the Acquisition Memory is managed as though it were a circular buffer, so those starting and ending locations in the resulting Acquisition Record are generally nearly adjacent, and located 'anywhere along the circle,' as it were.) The resulting displayed trace is, of necessity, severely compressed along the horizontal (time) dimension, and some clever rendering techniques are often required to create a useful image that is not downright deceptive and that correctly conveys some general sense of what signal activity is actually going on.

On the other hand, the operator may decide to view just a segment of the total Acquisition Record, and at a time scale selected from among predetermined choices. That is, within certain limits, the operator can both zoom and pan along the horizontal axis. This kind of operation has become (after the eventual emergence of user friendly controls to support it) the distinguishing hallmark of the DSO: those stuck with older analog equipment could only view with envy the measurements that their more newly equipped brethren could perform.

With this kind of flexibility comes some inevitable complexity. In this case, we can have what amounts to 'an entire strip chart's worth of data' but we still have just a tiny screen to view it on, and various techniques have emerged to help locate, and navigate back and forth between, separate events of interest in the 'whole trace.' The aggravation and chances for error associated with present navigation techniques are bound to become exacerbated with time, as DSOs with hundreds of megabytes of memory, and even memories in the gigabyte range, are poised to enter the marketplace. This situation will become one where a very long and detailed trace of a signal's waveform can be represented by the Acquisition Record (say, ten or one hundred times what is presently on the market). Besides simply panning along the trace with a manual control, there are configurable automatic tools to discover the existence of potential events of interest. However discovered, the locations in the Acquisition Record of such events of interest can be somehow marked (as with Bookmarks described in U.S. Pat. No. 6,958,754 B2, by Alexander & Oldfield) or their locations otherwise remembered with indexes that point to their locations. Alexander and Oldfield even provide a mechanism to go from one bookmark to any other.

The bookmark technique of Alexander and Oldfield requires the operator to manually establish a bookmark to represent an event of interest, and while it allows the association of a name and comment with a bookmark, the underlying indexing scheme is one based on the order in which the bookmarks are defined (which might be arbitrary), rather than the natural order of succession of the bookmarked events in the trace. So, when visiting bookmarks, and going from one to another, it is entirely up to the operator to ensure that his visits match the order of the succession of events (or of any other ordering), if that is his intent, as there is nothing inherent in the bookmark concept to support an ordering other than that with which the bookmarks were defined (within which ordering the notions of 'NEXT' and 'PREVIOUS' are indirectly available).

In some circumstances there are likely to be too many instances (say, thirty, fifty, a hundred?) of such events of interest to easily keep track of. What is needed is a way to easily and quickly navigate between (visit, and revisit) such a large number of events. This is particularly so in the case where the events to be visited are found by an automatic discovery mechanism (e.g., an automated measurement subsystem is asked to find everywhere that the rise time is greater than some amount, or wherever a transition in a selected direction does not achieve a minimum threshold). In such cases, the operator is asking the 'scope to find such locations, say, using automated measurement techniques set out and described (among other places) in U.S. patent application Ser. No. <unknown> filed 31 May 2006 and entitled COMPOSITE TRIGGER FOR A DIGITAL SAMPLING OSCILLOSCOPE. So, let's say that the 'scope found fifty-seven events in a really long trace that met some criteria that piques our interest. The automated measurement subsystem can scan the Acquisition Record to detect satisfactions of selected criteria, and even though it might tell us the number of such events, their minimums, maximum and averages, etc., it does not 'create a trail of bookmarks,' as it were. It is still up to the operator to manually direct the 'scope to display the trace segment for each of the events that met the criteria. We should like to do the next step: Quickly and easily view the fifty-seven events in the order they occurred, or, perhaps instead in the order of their severity; all the better to determine if any of them are worthy of continued interest and increased scrutiny. How to do it?

SIMPLIFIED DESCRIPTION

A solution to the problem of visiting discovered events in the trace of a DSO in the order of their occurrence is to equip the DSO with sets of event navigation controls (F, N, P & L and B, NB, NW & W) for displaying events discovered by an automatic measurement in a selected order. In a TIME Mode the controls operate to display the earliest or first (F) of those events, display the next (N) event after the one currently displayed, display the previous (P) event before the one currently displayed, and, display the last (L) event. In a SEVERITY Mode the controls operate to display the best (B) of those events, display the next best (NB) event relative to the one currently displayed, display the next worst (NW) event before the one currently displayed, and, display the worst (W) event. The notions of best and worst arise when a measured parameter, such as rise time, can be construed as a Figure Of Merit, and then ordered according to value.

Prior to operation in one of these modes the operator informs an automatic measurement subsystem of the criteria that defines an event of interest. Subsequent to the 'scope having made the measurements (a report typically appears, saying there were so many instances discovered, etc.) the operator may conjure the event navigation controls (if they are not already present). The sets of navigation controls may be a mode control menu accompanied by four stylized arrow shaped buttons within a GUI (Graphical User Interface) that are clicked on by an operator using a mouse. One set of arrow shaped button can serve for both modes, as their behaviors are similar. Alternatively, there can be no mode menu, but two different sets of four arrow shaped buttons, one set for each mode. As will become clear, navigation operations within the different modes may be intermixed without ambiguity, and it is merely a choice as to whether to implement a mode selector and one set of four operations, or, no mode selection and two sets of four operations (four buttons twice is eight buttons), with each set of operations associated with a different mode.

In the TIME Mode, if none of the controls has previously been invoked for the present Acquisition Record, the F, N and P behave the same: an effective F. Once there has been an effective or an actual F, N behaves as expected, and once there has been an N or an L, P behaves as expected. L always goes to the last event, even if that should also be the only (and therefore also the first) event. Navigation to discovered events subsequent to the automatic measurement that discovers those events can be based on one of two strategies:

(I) The automated measure subsystem scans the Acquisition Record only once. An Event Location Table (i.e., a list containing their locations in the Acquisition Record and associated display production parameters) can be maintained and this list is traversed as F, N, P and L are issued by the operator. The display production parameters retrieved from the list are passed to the display subsystem.

(II) The automatic measurement subsystem itself can be passed the navigation commands and it then:
  (I) Unconditionally does an F or an L and passes to the display subsystem the appropriate segment of the Acquisition Record.
  (ii) Remembers what it did last, so it knows what event is currently displayed; and
  (iii) For N and P, re-inspects the Acquisition Record from the location of the event currently displayed to locate and pass to the display subsystem the appropriate segment of the Acquisition Record.

The latter method (II) has the advantage that, while some 'extra' activity can be needed to perform each step in a traverse, the operator is now able to edit the automatic search criteria to refine (within some reasonable limitations) what events are presented, and do so incrementally without having to begin the whole process over again, and without having to again 'work his way into' an interesting spot in the trace from an initial F or L.

Similar remarks obtain for operation in the SEVERITY Mode.

When the operator places the 'scope in RUN it will operate with some (initial) horizontal scale and position selected by the operator. After the 'scope has acquired a trace and has been STOP'ed, and the operator has performed an automated measurement, he can then use the aforementioned navigation controls to navigate to an event discovered by the automatic measurement subsystem. This navigation process will, similar to the 'AUTO-SCALE' feature found on many 'scopes, select (and then use) suggested best display parameters for viewing the event. The operator might, however, choose to change the horizontal scale and position to better view the event or trace segments surrounding it. However, if he should then again place the 'scope in RUN, the initial horizontal scale and position values will then be reinstated. (Of course, once the 'scope is again running, they can be changed, just as they always could.)

DETAILED DESCRIPTION

Figure 1:
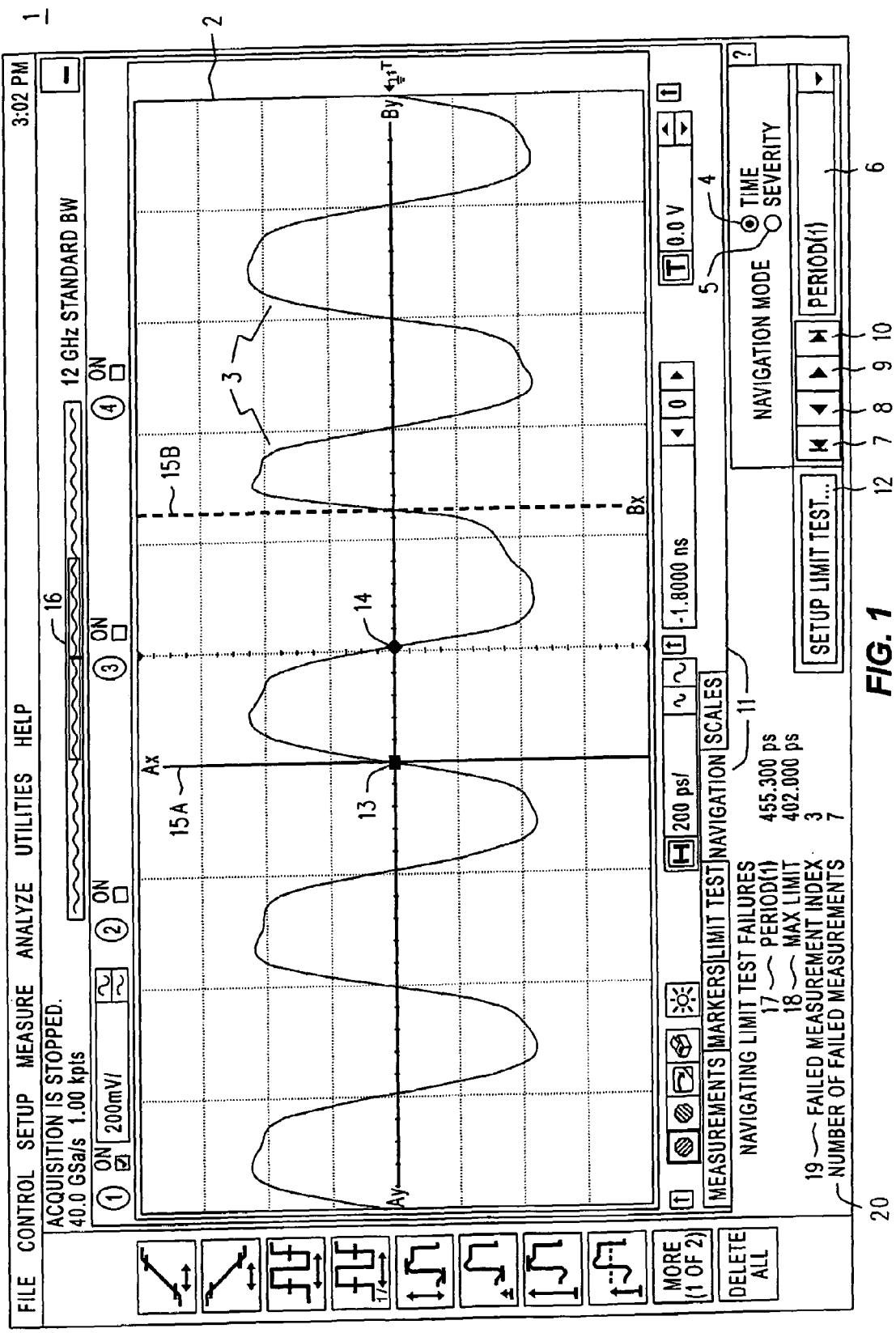
FIG. 1 is a screen shot of one implementation of a GUI for selectable navigation to automatically discovered events within the acquisition record of a digital sampling oscilloscope.

Refer now to FIG. 1, wherein is shown a screen shot 1 of a DSO that incorporates selected navigation to discovered events within its Acquisition Record. The DSO may be any of the DSO8XXX, MSO8XXX, or 548XX series of Digital Sampling Oscilloscopes from Agilent Technologies, Inc. In particular, a window 2 contains a portion 3 of a trace that has been navigated to in response to conditions discovered by an Automatic Measurement Subsystem. The relative position of the displayed trace segment 3 within the overall captured trace is indicated by a highlighted portion within a Memory bar 16. Such indication is itself conventional, and occurs for whatever trace segment is displayed, no matter how that segment is selected or arrived at. Furthermore, the details of how the Automatic Measurement Subsystem was instructed to look for certain measurable features or events in the Acquisition Record are conventional, and have been largely omitted for the sake of brevity. What we can see is that within the selected tab NAVIGATION (11) there is a collection of indicia (17, 18, 19 and 20) that cooperates with the legend of drop down menu 6 and SETUP LIMIT TEST box 12 to place a period measurement in effect, with a MAX LIMIT (18) of 402.000 ps. We further see that for the NAVIGATION MODE a radio button 4 has been pressed, to select a TIME mode. In the TIME Mode the events discovered by the Automatic Measurement Subsystem are accessible according to their order of occurrence in the overall trace. We presume also that one of the navigation buttons 7, 8, 9 or 10 has subsequently been clicked upon to instruct the system to find some particular (7:F-first, 8:P-previous, 9:N-next or 10:L-last) instance of discovered event. Legend 20 indicates that there are a total of seven failed measurements, and legend 19 indicates that the third of these is what is shown by the trace segment 3 in window 2. Shaped indicator 13 (the solid rectangle) and cursor markers 15A-B in the display cooperate in showing what portion of the displayed trace segment 3 caused the automatic period measurement criterion to be satisfied (i.e., to become the third failed/discovered measurement). Legend 17 indicates that the reason the third discovered event is a failed measurement is because the automatically measured period at that location in the trace is 455.300 ps, which exceeds the limit of 402.000 ps. Indicator 14 is presumably associated with another automatic measurement (perhaps fall time) that has been defined (using the MEASUREMENT tab instead of the NAVIGATION tab) but which is not currently being navigated upon. Indicator 13 and cursor marker 15A are coincident along the time axis, since indicators of its shape (rectangle) have been (elsewhere) declared to be associated with period limit measurements on channel one, which happens also to be what we are navigating upon.

Another radio button 5 sets a SEVERITY Mode in which the discovered events are accessible according to a Figure Of Merit associated with the selected measurement (e.g., a period measurement for some cycle exceeded a limit by more than other cycles did). In the SEVERITY Mode the four arrow buttons 7, 8, 9 and 10 would respectively correspond to the operations B-best, NB-next best, NW-next worst and W-worst.

In the TIME Mode, if none of the controls has previously been invoked for the present Acquisition Record, the F, N and P behave the same: an effective F. Once there has been an effective or an actual F, N behaves as expected, and once there has been an N or an L, P behaves as expected. L always goes to the last event, even if that should also be the only (and therefore also the first) event.

In the SEVERITY Mode, if none of the controls has previously been invoked for the present Acquisition Record, the B and NB behave the same: an effective B. Likewise, and initial NW and W behave as a W. Once there has been an effective or an actual B, NB behaves as expected, and once there has been an effective or actual W, NW behaves as expected. W always goes to the worst event, even if that should also be the only (and therefore also the best) event, or if all events are the same.

While we have not, for the sake of brevity, shown an actual sequence of screen shots that corresponds to it, the reader will nevertheless appreciate that each time one of the buttons 7-10 is clicked on the system will decide if a different trace segment is to be displayed (as well as put onto the NAVIGATION tab 11 the corresponding descriptive indicia (13, 15A/B, 19) for that displayed segment).

Figure 2:
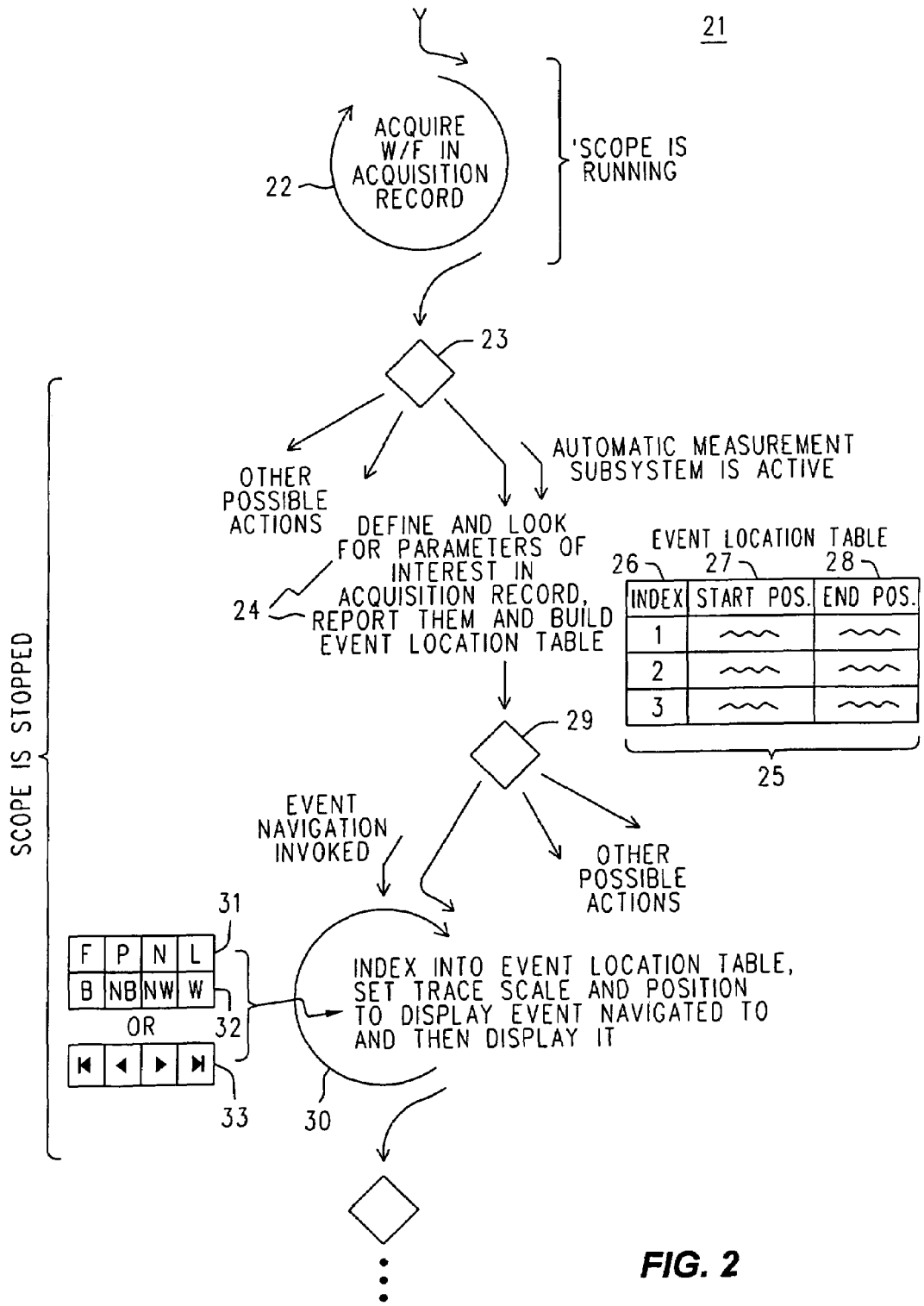
FIG. 2 is a simplified flowchart depicting aspects of a first manner of internal operation within the digital sampling oscilloscope of FIG. 1 during selectable navigation to automatically discovered events within an acquisition record.

Now refer to FIG. 2. It is a simplified flowchart 21 that describes a first strategy for implementing the navigation described in connection with FIG. 1. In this first strategy the Automated Measurement Subsystem scans the Acquisition Record only once. An Event Location Table 25 (i.e., a list containing their locations in the Acquisition Record and associated display production parameters) can be maintained and this list is traversed as the commands F/B, N/NB, P/NW and L/W (7-10,31-33) are issued by the operator. The display production parameters retrieved from the Event Location Table are passed to the display subsystem.

This first manner of operation is illustrated by the flowchart 21 as follows. At step 22 the 'scope is RUN'ing and a acquires a digitized version of a waveform in an Acquisition Memory. Presumably, at some time the 'scope is triggered and the ' scope becomes STOP'ed. Qualifier 23 represents the possibility that other types of operation might ensue (one of which might be the specification of automatic measurements, although that could have also been accomplished much earlier).

In any event, once the Automatic Measurement Subsystem is active, step 24 is looking for parameters of interest in the Acquisition Record, reporting them (indicia 13, 15A/B, 17-20 of FIG. 1) and building an Event Location Table 25 that places the discovered events in some order according to an index (26), and associates with that index the START POSITION (27) and the END POSITION (28) to be used in displaying that discovered event as that indexed segment. It will be noted that the START POSITION (27) and END POSITION (28) correspond respectively to cursor markers 15A and 15B. Step 24 begins with the phrase 'DEFINE AND LOOK FOR . . . ". By this is meant that if the definition is not yet made, or if a different definition is desired, such definition can be performed (or performed again). If a new definition is made, then the Event Location Table 25 is built anew. On the other hand, a satisfactory definition may already be in effect, in which case step 24 amounts to "LOOK FOR . . . ".

A note is in order concerning the index 26. We have shown it as an integer that starts at one and counts up. If the TIME Mode is in effect, then an index value of one could represent 'first' discovered event and an index of two the next event (the second one), and so on, with the $n^{th}$ entry corresponding to the last discovered event. Likewise, if the SEVERITY Mode were in effect, then an index of one could represent the best, and two the (first) next best, three the next (second) next best, and so on. Implicit in this, but not explicitly shown (it would appear to be an implementation detail) is that if the operator "pulls the rug out from under the table 25" by switching from one Mode to the other, the Event Location Table 25 would have to be re-constructed. On the other hand, this annoyance can be avoided by maintaining two indexes from the start— one for the TIME Mode and one for the SEVERITY mode. For the sake of brevity, we have not shown such an arrangement, but it will certainly be readily appreciated.

In any event, once the Event Location Table 25 is created subsequent to an investigation of the Acquisition Record according to the definition in use, qualifier 29 leads (assuming no other actions intervene) to step 33, where the system indexes into the Event Location Table according to one of the commands 31-33 (and, of course taking into account the Mode in effect). Then the display parameters are set to an appropriate time scale (i.e., taking into account the difference between START POSITION 27 and END POSITION 28) and time reference position (the average of values 27 and 28) according to what is indexed in the table, and the discovered event that has just been navigated to is then displayed (e.g., 3 in FIG. 1).

Figure 3:
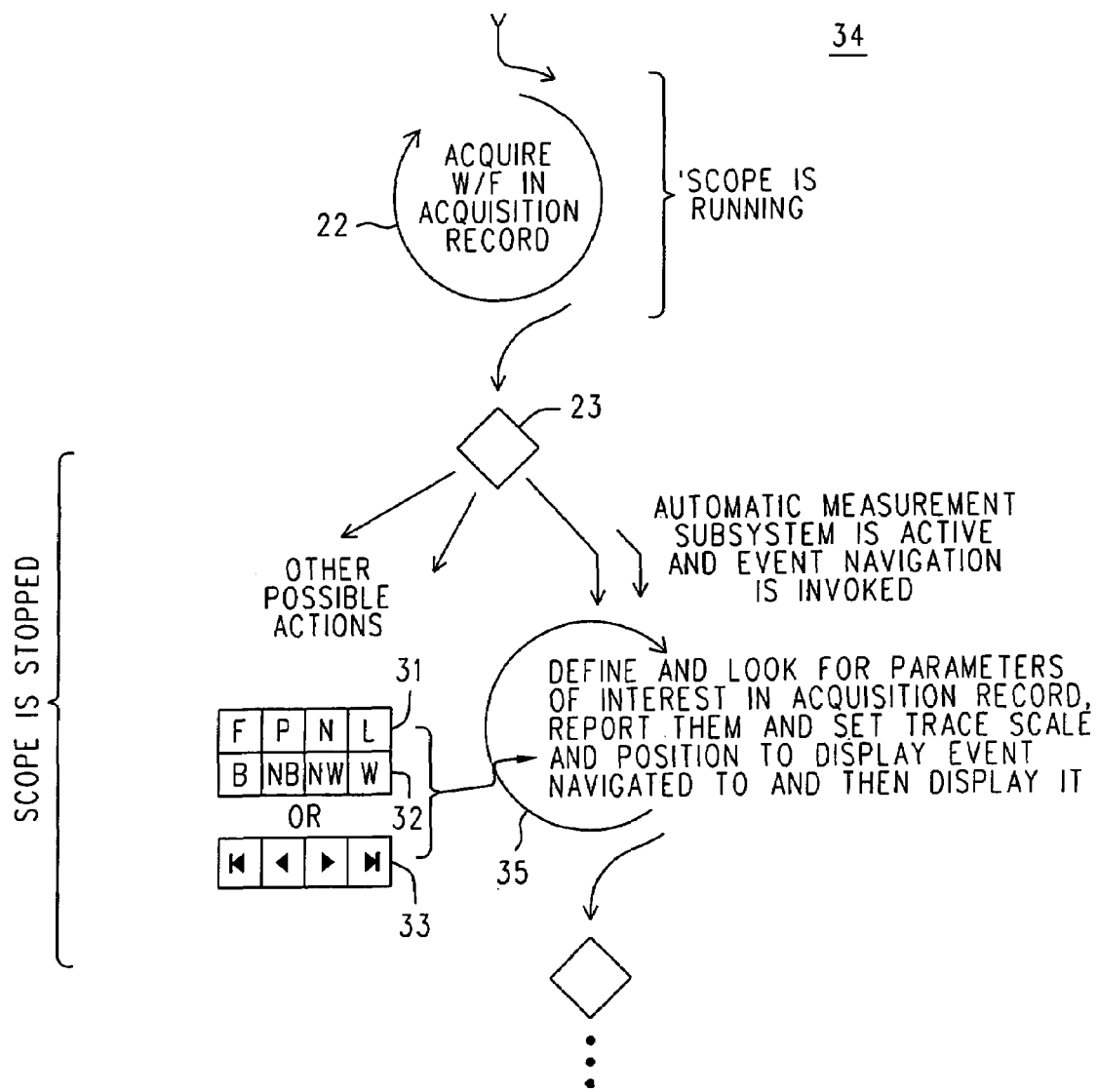
FIG. 3 is a simplified flowchart depicting aspects of a first manner of internal operation within the digital sampling oscilloscope of FIG. 1 during selectable navigation to automatically discovered events within an acquisition record.

FIG. 3 is a simplified flowchart 34 that describes a second strategy for implementing the navigation described in connection with FIG. 1. In this second strategy the Automated Measurement Subsystem scans the Acquisition Record once for each navigation command. No Event Location Table is maintained, and instead the Acquisition Record itself is traversed as the commands F/B, N/NB, P/NW and L/W (7-10, 31-33) are issued by the operator. The display production parameters are produced as before, and are passed to the display subsystem.

This second manner of operation is illustrated by the flowchart 34 as follows. Step 22 and Qualifier 23 are as they were for FIG. 2. Once the Automatic Measurement Subsystem is active, step 35 is to look, according to the issued commands (31-33) and the Mode in effect, for parameters of interest in the Acquisition Record, report them (indicia 13, 15A/B, 17-20 of FIG. 1) and having also determined the display production parameters, pass them to the Display Subsystem (which, of course, displays the discovered event just navigated to).

I claim:

1. A method of displaying selected portions of interest within a waveform measured by a digital sampling oscilloscope, the method comprising the steps of:

(a) measuring a signal's waveform with a digital sampling oscilloscope by sampling the signal's values and storing them as an Acquisition Record;

(b) defining criteria by which an Automatic Measurement Subsystem can locate events of interest within the Acquisition Record;

(c) subsequent to steps (a) and (b), traversing the Acquisition Record stored in step (a) to locate events therein that meet the criteria defined in step (b);

(d) storing in an event location table the locations in the Acquisition Record where there are events located by the traverse of step (c);

(e) subsequent to step (d), traversing the event location table of step (d) in response to activation of selected controls to do so; and (f) displaying upon a screen of the digital sampling oscilloscope a trace that represents the portion of the signal's waveform that corresponds to an entry in the event location table to which there has been a traverse in step (e).

2. A method as in claim 1 wherein the traverse of step (e) produces, in the order of their occurrence in time, the locations of successive events of interest found in step (c).

3. A method as in claim 2 wherein the selected controls include traversing in step (e) to the first event.

4. A method as in claim 2 wherein the selected controls include traversing in step (e) to the next event.

5. A method as in claim 2 wherein the selected controls include traversing in step (e) to the previous event.

6. A method as in claim 2 wherein the selected controls include traversing in step (e) to the last event.

7. A method as in claim 1 wherein the traverse of step (e) produces, in an order arranged according to a FIG. Of Merit, the locations of successive events of interest found in step (c).

8. A method as in claim 7 wherein the selected controls include traversing in step (e) to the best event.

9. A method as in claim 7 wherein the selected controls include traversing in step (e) to the next best event.

10. A method as in claim 7 wherein the selected controls include traversing in step (e) to the next worst event.

11. A method as in claim 7 wherein the selected controls include traversing in step (e) to the worst event.

12. A method of displaying selected portions of interest within a waveform measured by a digital sampling oscilloscope, the method comprising the steps of:
(a) measuring a signal's waveform with a digital sampling oscilloscope by sampling the signal's values and storing them as an Acquisition Record;
(b) defining criteria by which an Automatic Measurement Subsystem can locate events of interest within the Acquisition Record;
(c) subsequent to steps (a) and (b), traversing the Acquisition Record in response to activation of a selected control to do so, and locating an event in the Acquisition Record that meets the criteria defined in step (b) and that satisfies a meaning of the selected control; and
(d) displaying upon a screen of the digital sampling oscilloscope a trace that represents the portion of the signal's waveform that corresponds to the event(s) located step (c).

13. A method as in claim 12 wherein the traverse of step (c) produces, in the order of their occurrence in time, the locations of successive events of interest defined in step (b).

14. A method as in claim 13 wherein the meaning of the selected control is traversing to the first event.

15. A method as in claim 13 wherein the meaning of the selected control is traversing to the next event.

16. A method as in claim 13 wherein the meaning of the selected control is traversing to the previous event.

17. A method as in claim 13 wherein the meaning of the selected control is traversing to the last event.

18. A method as in claim 12 wherein the traverse of step (c) produces, in an order arranged according to a FIG. Of Merit, the locations of successive events of interest defined in step (b).

19. A method as in claim 18 wherein the meaning of the selected control is traversing to the best event.

20. A method as in claim 18 wherein the meaning of the selected control is traversing to the next best event.

21. A method as in claim 18 wherein the meaning of the selected control is traversing to the next worst event.

22. A method as in claim 18 wherein the meaning of the selected control is traversing to the worst event.

* * * * *

UNITED STATES PATENT AND TRADEMARK OFFICE
CERTIFICATE OF CORRECTION

PATENT NO.       : 7,460,967 B2  
APPLICATION NO.  : 11/476546  
DATED            : December 2, 2008  
INVENTOR(S)      : Christopher P Duff Page 1 of 1

It is certified that error appears in the above-identified patent and that said Letters Patent is hereby corrected as shown below:

In column 10, line 8, in Claim 12, after "located" insert -- in --.

Signed and Sealed this

Twenty-eighth Day of April, 2009

JOHN DOLL  
*Acting Director of the United States Patent and Trademark Office*